United States Patent
Belhachemi et al.

(10) Patent No.: US 11,979,132 B2
(45) Date of Patent: May 7, 2024

(54) METHOD FOR MANUFACTURING A SUBSTRATE FOR A RADIOFREQUENCY FILTER

(71) Applicant: Soitec, Bernin (FR)

(72) Inventors: Djamel Belhachemi, Saint Martin d'heres (FR); Thierry Barge, Chevrieres (FR)

(73) Assignee: Soitec, Bernin (FR)

( * ) Notice: Subject to any disclaimer, the term of this patent is extended or adjusted under 35 U.S.C. 154(b) by 777 days.

(21) Appl. No.: 17/042,016

(22) PCT Filed: Mar. 27, 2019

(86) PCT No.: PCT/IB2019/000204
§ 371 (c)(1),
(2) Date: Sep. 25, 2020

(87) PCT Pub. No.: WO2019/186265
PCT Pub. Date: Oct. 3, 2019

(65) Prior Publication Data
US 2021/0159869 A1   May 27, 2021

(30) Foreign Application Priority Data

Mar. 29, 2018 (FR) ....................... 1800258

(51) Int. Cl.
*H03H 3/02* (2006.01)
*H10N 30/00* (2023.01)
(Continued)

(52) U.S. Cl.
CPC .............. *H03H 3/02* (2013.01); *H10N 30/05* (2023.02); *H10N 30/073* (2023.02);
(Continued)

(58) Field of Classification Search
CPC .............. Y10T 29/42; Y10T 29/49005; Y10T 29/49016; Y10T 29/49155; H03H 3/02;
(Continued)

(56) References Cited

U.S. PATENT DOCUMENTS 9,118,000 B2* 8/2015 Kang ................... H10N 30/092
9,570,668 B2* 2/2017 Iwamoto ................ H10N 30/05
(Continued)

FOREIGN PATENT DOCUMENTS

CN    86105660 A   2/1987
CN    1004669 B    6/1989
(Continued)

OTHER PUBLICATIONS

Japanese Office Action for Application No. 2020-552315 dated Jan. 24, 2023, 5 pages.
(Continued)

*Primary Examiner* — Thiem D Phan
(74) *Attorney, Agent, or Firm* — TraskBritt

(57) ABSTRACT

A method for manufacturing a substrate for a radiofrequency filter by joining a piezoelectric layer to a carrier substrate via an electrically insulating layer, wherein the method comprises depositing the electrically insulating layer by spin coating an oxide belonging to the family of SOGs (spin-on glasses) on the surface of the piezoelectric layer to be joined to the carrier substrate, followed by an anneal for densifying the electrically insulating layer before joining the piezoelectric layer to the carrier substrate via the electrically insulating layer.

5 Claims, 2 Drawing Sheets

(51) Int. Cl.
  *H10N 30/05* (2023.01)
  *H10N 30/073* (2023.01)
  *H10N 30/853* (2023.01)
(52) U.S. Cl.
  CPC ... *H10N 30/10516* (2023.02); *H10N 30/8542* (2023.02); *Y10T 29/42* (2015.01)
(58) Field of Classification Search
  CPC ........ H03H 3/08; H03H 9/0571; H03H 9/562; H01L 2224/11
  USPC ............... 29/25.35, 825, 829, 846, 874, 877
  See application file for complete search history.

(56) References Cited

U.S. PATENT DOCUMENTS

| | | |
|---|---|---|
| 2002/0048728 A1 | 4/2002 | Zhou |
| 2011/0195575 A1 | 8/2011 | Wang |
| 2014/0167565 A1 | 6/2014 | Iwamoto |
| 2020/0336127 A1 | 10/2020 | Gaudin et al. |

FOREIGN PATENT DOCUMENTS

| | | | |
|---|---|---|---|
| CN | 101248515 A | 8/2008 | |
| CN | 103378817 A | 10/2013 | |
| JP | 1998-144673 A | 5/1998 | |
| JP | 2002-009584 A | 1/2002 | |
| JP | 2002-330047 A | 11/2002 | |
| JP | 2009-089006 A | 4/2009 | |
| JP | 2012-085286 A | 4/2012 | |
| JP | 2013-179405 A | 9/2013 | |
| JP | 2013-225652 A | 10/2013 | |
| JP | 2017-532758 A | 11/2017 | |
| JP | 2018-014606 A | 1/2018 | |
| WO | 2013/031617 A1 | 3/2013 | |
| WO | 2018/002504 A1 | 1/2018 | |

OTHER PUBLICATIONS

International Search Report for International Application No. PCT/IB2019/000204 dated Jul. 26, 2019, 2 pages.
International Written Opinion for International Application No. PCT/IB2019/000204 dated Jul. 26, 2019, 6 pages.
Japanese Notice of Final Decision for Application No. 2020-552315 dated Jun. 6, 2023, 6 pages.
Korean Office Action for Application No. 10-2020-7029780 dated Apr. 12, 2023, 7 pages.
Singapore Search Report and Written Opinion from Singapore Application No. 11202009531Q, dated Sep. 30, 2021, 9 pages.
Chinese Second Office Action for Application No. 201980023115.3 dated Feb. 21, 2024, 20 pages with machine translation.

* cited by examiner

METHOD FOR MANUFACTURING A SUBSTRATE FOR A RADIOFREQUENCY FILTER

CROSS-REFERENCE TO RELATED APPLICATIONS

This application is a national phase entry under 35 U.S.C. § 371 of International Patent Application PCT/IB2019/000204, filed Mar. 27, 2019, designating the United States of America and published in French as International Patent Publication WO 2019/186265 A1 on Oct. 3, 2019, which claims the benefit under Article 8 of the Patent Cooperation Treaty to French Patent Application Serial No. 1800258, filed Mar. 29, 2018.

TECHNICAL FIELD

This disclosure relates to a process for producing a substrate for a radiofrequency filter.

BACKGROUND

It is known practice to produce a radiofrequency (RF) device, such as a resonator or filter, on a substrate comprising, successively, from its base to its surface, a carrier substrate, generally made of a semiconductor material such as silicon, an electrically insulating layer and a piezoelectric layer.

The piezoelectric materials usually used, such as lithium niobate or lithium tantalate, have thermal expansion coefficients that are quite high and anisotropic, which makes it difficult to join them to carrier substrates such as silicon. Problems of breakage or detachment during thermal annealing in the processing, packaging or dicing steps may make such joined substrates unsuitable.

In addition, surface acoustic wave (SAW) filters typically comprise a thick piezoelectric layer (i.e., with a thickness generally of several tens of µm) and two electrodes in the form of two interdigitated metal combs deposited on the surface of the piezoelectric layer. An electrical signal, typically a voltage variation, applied to an electrode is converted into an elastic wave that propagates at the surface of the piezoelectric layer. The propagation of this elastic wave is favored if the frequency of the wave corresponds to the frequency band of the filter. This wave is converted into an electrical signal again when it reaches the other electrode.

However, there are parasitic modes of propagation of the wave that extend into the thickness of the piezoelectric layer and are liable to be reflected at the interface with the carrier substrate beneath. This phenomenon is called "rattle."

To avoid these parasitic modes, it is known practice to make the surface of the piezoelectric layer located at the interface with the electrically insulating layer rough enough to allow the parasitic waves to be reflected in all directions (scatter effect) and prevent their transmission into the substrate.

Given the wavelength in question, the roughness of the surface of the piezoelectric layer is very high, of the order of a few µm.

Producing the substrate entails bonding the rough surface of the piezoelectric layer, potentially covered with the electrically insulating layer, to the carrier substrate. However, to ensure good adhesion between the piezoelectric layer and the carrier substrate despite such roughness, the current process requires a large number of successive steps, which makes it lengthy and expensive.

BRIEF SUMMARY

The present disclosure overcomes these limitations of the prior art by providing a process for producing a substrate for a radiofrequency filter. In this way, it is possible to solve the problems that are currently encountered.

The present disclosure relates to a process for fabricating a substrate for a radiofrequency filter by joining a piezoelectric layer to a carrier substrate via an electrically insulating layer, characterized in that it comprises the steps of depositing the electrically insulating layer by spin coating an oxide belonging to the family of SOGs (spin-on glasses) on the surface of the piezoelectric layer to be joined to the carrier substrate, followed by an anneal for densifying the electrically insulating layer before joining.

In advantageous embodiments, the thickness of the piezoelectric layer is greater than 5 µm, preferably greater than 10 µm.

In advantageous embodiments, the surface of the piezoelectric layer to be joined to the carrier substrate has a rough surface suitable for reflecting a radiofrequency wave.

In advantageous embodiments, the rough surface of the piezoelectric layer has a roughness of greater than 1 µm, preferably greater than 3 µm.

In advantageous embodiments, the carrier substrate is made of silicon material.

In advantageous embodiments, the carrier substrate made of silicon material comprises a trapping layer towards the interface to be joined with the piezoelectric layer.

In advantageous embodiments, the piezoelectric layer (200, 200') is made of lithium niobate or lithium tantalate.

BRIEF DESCRIPTION OF THE DRAWINGS

Other features and advantages of the present disclosure will be better understood from reading the following detailed description with reference to the appended drawings in which.

To improve the readability of the figures, the various layers are not necessarily shown to scale.

DETAILED DESCRIPTION

Figure 1:
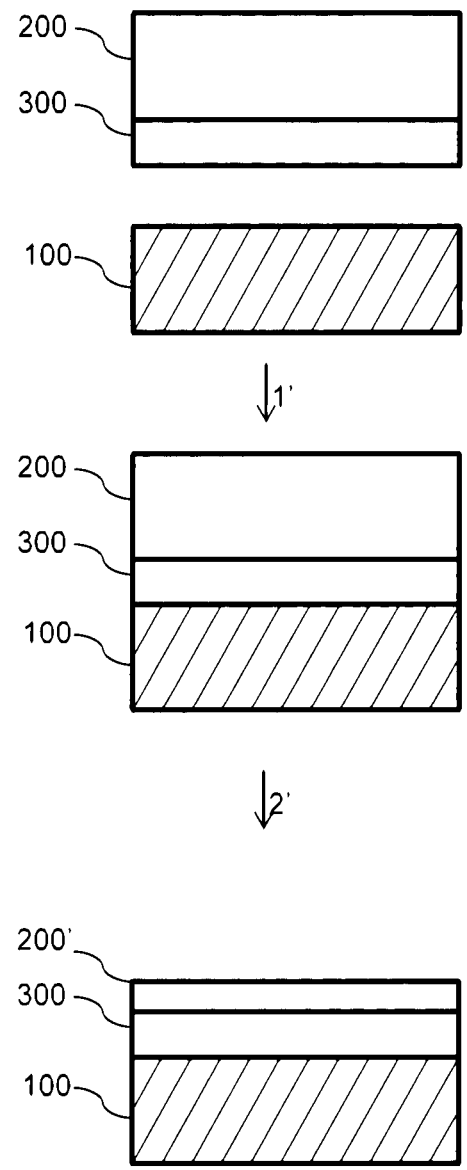
FIG. 1 illustrates a process for producing a substrate for a radiofrequency filter according to one embodiment of the disclosure.

FIG. 1 schematically illustrates the process for producing a substrate for a radiofrequency filter according to one embodiment of the present disclosure. FIG. 1 illustrates a carrier substrate 100 to which a piezoelectric layer 200 is joined via an electrically insulating layer 300.

The electrically insulating layer is generally chosen from the family of SOGs (spin-on glasses), which exhibit the property of being in the liquid state at ambient temperature but may be densified, and solidified, by means of a suitable heat treatment.

This technique consists in rotating the substrate on which the electrically insulating layer 300 is to be deposited at a substantially constant and relatively high speed in order to spread the layer in the liquid state uniformly over the entire surface of the substrate by centrifugal force. To this end, the substrate is typically placed and held by vacuum chuck on a turntable.

A person skilled in the art is capable of determining the operating conditions, such as the volume deposited on the surface of the substrate, the speed of rotation of the substrate, and the minimum deposition time according to the desired thickness for the adhesive layer.

The thickness of the electrically insulating layer 300 is typically between 2 μm and 8 μm. Additionally, the spin coating technique used is advantageous in that the deposition of the insulating layer 300 is carried out at ambient temperature, and is followed by a densifying anneal at a temperature of around 250° C., which, therefore, does not cause the substrate on which the dielectric layer is formed to deform.

An electrically insulating layer 300 of oxide of SOG type makes it possible to maintain the acoustic performance of a radiofrequency device obtained later from a piezoelectric substrate at an optimal level.

According to one non-limiting example, the electrically insulating layer 300 may be chosen from families of SOGs of "silicate" or "methylsilsesquioxane" type, sold, for example, under the references "20B" or "400F" by FILMTRONICS or "FOX16" by DOW CORNING.

The piezoelectric layer 200 on which the electrically insulating layer 300 has been deposited and densified is preferably joined to the carrier substrate 100 via direct bonding by molecular adhesion, as illustrated in Step 1' in FIG. 1. The bonding is preferably carried out at ambient temperature, namely about 20° C. It is however possible to carry out the bonding with a heat treatment at a temperature of between 20° C. and 50° C., and more preferably between 20° C. and 30° C.

Additionally, the bonding step is advantageously carried out at low pressure, i.e., at a pressure lower than or equal to 5 mTorr, which makes it possible to desorb the water from the surfaces forming the bonding interface, i.e., the surface of the electrically insulating layer 300 and the surface of the carrier substrate 100. Carrying out the bonding step under vacuum makes it possible to improve the desorption of water at the bonding interface further still.

A heat treatment in order to strengthen the bonding interface may be carried out at low temperatures of up to 300° C. without the entire assembly undergoing overly substantial deformations leading to the materials breaking or detachment at the bonding interface.

The bonding energy obtained by the direct bonding between the surface of the carrier substrate 100 and the electrically insulating layer 300 of the present disclosure is high and allows not only the Step 2' of thinning the piezoelectric layer by chemical-mechanical polishing (CMP) (as shown in FIG. 1) but also the final dicing of the assembled wafer in order to obtain radiofrequency devices, despite a substantial difference in thermal expansion coefficient of the piezoelectric materials of the piezoelectric layer 200 used and of the material of the carrier substrate 100 used.

According to one non-limiting example of the disclosure, the carrier substrate 100 may be made of silicon material.

Figure 2:
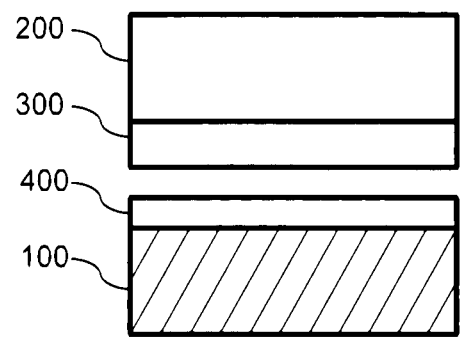
FIG. 2 illustrates a process for producing a substrate for a radiofrequency filter according to another embodiment of the disclosure.
Figure 2:
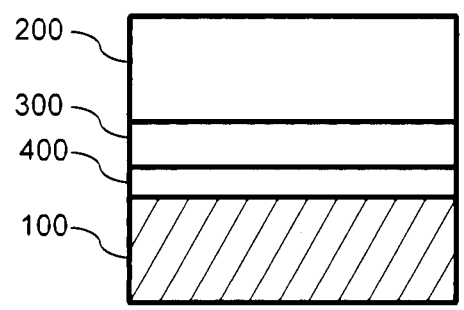
Figure 2:
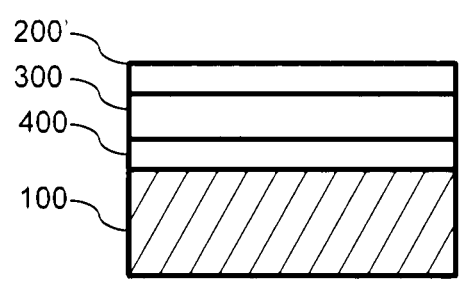

According to another non-limiting embodiment, illustrated schematically in FIG. 2, the carrier substrate 100 may be silicon material further comprising a trapping layer 400 towards the interface to be joined, in Step 1' of FIG. 2, with the electrically insulating layer 300, making it possible to trap electric-charge carriers caused by the frequency operation of the radiofrequency device. This layer thus makes it possible to decrease insertion losses and improve the performance of the devices.

According to one non-limiting example of the disclosure, the piezoelectric material may be chosen from lithium niobate and lithium tantalate.

The predetermined thickness of the piezoelectric layer 200 is preferably greater than 5 μm, or more preferably greater than 10 μm.

Given the substantial difference in thermal expansion coefficient, such a high thickness leads to stresses that are difficult to withstand experienced by the assembly of the piezoelectric layer 200 on the carrier substrate 100. The assembly according to the present disclosure allows bonding energies to be obtained that make it possible to keep the substrate mechanically intact, which substrate could thus undergo process steps such as thinning Steps 2' as shown in FIG. 2, electrode-depositing steps involving temperatures of up to 300° C., or dicing steps in order to separate the radiofrequency devices obtained on this joined substrate.

According to one non-limiting example of the disclosure, the surface of the piezoelectric layer 200 to be joined to the carrier substrate has a rough surface suitable for reflecting a radiofrequency wave. This makes it possible to decrease the impact of parasitic waves reflected at any interfaces present within a hybrid substrate of a piezoelectric layer joined to a carrier. In advantageous embodiments, the rough surface of the piezoelectric layer has a roughness of greater than 1 μm, preferably greater than 3 μm, corresponding substantially to the length of the parasitic waves. Additionally, these parasitic waves appear in particular for piezoelectric structures with a thickness of greater than 5 μm, or 10 μm, for which the assembly of the present disclosure affords advantages. It should be noted that the spin coating technique has a smoothing effect and envisaged thicknesses of the electrically insulating layer 300 of between 2 μm and 8 μm make it possible not only to obtain an assembly having a good bonding energy but also to avoid additional steps of planarization and smoothing if this spin coating deposition is applied to a rough surface such as described above.

The invention claimed is:

1. A method for fabricating a substrate for a radiofrequency filter, comprising:
   depositing an electrically insulating layer by spin coating an oxide belonging to the family of spin-on glasses (SOGs) on a surface of a piezoelectric layer to be joined to a carrier substrate;
   annealing and densifying the electrically insulating layer after depositing the electrically insulating layer by spin coating on the surface of a piezoelectric layer; and
   after annealing and densifying the electrically insulating layer, joining the piezoelectric layer to the carrier substrate via the electrically insulating layer, wherein
   a thickness of the piezoelectric layer is greater than 10 μm,
   the surface of the piezoelectric layer to be joined to the carrier substrate has a rough surface suitable for reflecting a radiofrequency wave, and
   the rough surface of the piezoelectric layer has a roughness of greater than 1 μm.

2. The method of claim 1, wherein the rough surface of the piezoelectric layer has a roughness of greater than 3 μm.

3. The method of claim 2, wherein the carrier substrate comprises silicon.

4. The method of claim 3, wherein the carrier substrate further comprises a trapping layer toward an interface to be joined with the piezoelectric layer.

5. The method of claim 4, wherein the piezoelectric layer comprises lithium niobate or lithium tantalate.

\* \* \* \* \*